(12) United States Patent
Lemaire

(10) Patent No.: US 6,720,639 B2
(45) Date of Patent: Apr. 13, 2004

(54) INTEGRATED INDUCTANCE STRUCTURE

(75) Inventor: Frédéric Lemaire, Saint Egreve (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/074,260

(22) Filed: Feb. 12, 2002

(65) Prior Publication Data

US 2002/0113290 A1 Aug. 22, 2002

(30) Foreign Application Priority Data

Feb. 12, 2001 (FR) .............................. 01 01881

(51) Int. Cl.$^7$ ................................................ H01L 29/00
(52) U.S. Cl. ........................................ 257/531; 257/277
(58) Field of Search ................................ 257/531, 277, 257/532, 536

(56) References Cited

U.S. PATENT DOCUMENTS 5,760,456 A  6/1998  Grzegorek et al.

2002/0074620 A1 * 6/2002 Yue ............................. 257/531
2002/0084509 A1 * 7/2002 Ballantine et al. .......... 257/531

FOREIGN PATENT DOCUMENTS

WO    WO 00 67320    11/2000

OTHER PUBLICATIONS

French Search Report from French Patent Application 01 01881, filed Feb. 12, 2001.

Patent Abstracts of Japan, vol. 1996, No. 04, Apr. 30, 1996 & JP 07 326517 A (Kyocera Corp.).

* cited by examiner

*Primary Examiner*—Phat X. Cao
(74) *Attorney, Agent, or Firm*—Lisa K. Jorgenson; James H. Morris; Wolf, Greenfield & Sacks, P.C.

(57) ABSTRACT

An integrated circuit inductance structure, including a silicon substrate, a planar winding of a conductive track, a resistive layer, not etched under the winding, a dielectric layer between the winding and said resistive layer, and discontinuous conductive sections, individually parallel to a portion of the winding which is the closest and electrically connected to ground and to the more heavily-doped layer.

8 Claims, 4 Drawing Sheets

INTEGRATED INDUCTANCE STRUCTURE

BACKGROUND OF THE INVENTION

1. Field of the Invention

The present invention relates to the field of integrated circuits, and more specifically to an inductance formed on a semiconductor substrate.

2. Discussion of the Related Art

FIG. 1 shows, in a very simplified perspective view, a first example of a conventional inductance 1 formed on a semiconductor substrate 2. Inductance 1 includes a number of generally concentric turns or spirals obtained by the deposition of a conductive element on an insulating layer (dielectric 3). The number of turns may also be smaller than 1. Insulating layer 3, for example silicon oxide, rests on semiconductor substrate 2, or on the penultimate metallization level (not shown) added on this substrate after forming of the other components, which are integrated (for example, transistors and the like). Substrate 2 is assumed to be grounded by its lower surface, to simplify the discussion.

FIG. 2 shows the equivalent electric diagram of inductance 1 of FIG. 1. Inductance 1 is symbolized in the form of a perfect inductance L in series with a resistor Rs between two terminals 5 and 6 corresponding to the ends of the winding of FIG. 1. Dielectric 3 forms stray capacitances C between the inductance and the substrate. Further, substrate 2 is resistive and it exhibits resistors R between its upper and lower surfaces. Resistors R ground each electrode of a capacitor C opposite to inductance L.

A disadvantage of an inductance such as illustrated in FIG. 1 is its high losses. When the inductance conducts a variable current, these losses occur via resistor Rs, capacitors C, and resistors R, and have the disadvantage of strongly decreasing the quality factor of the inductance. This quality factor depends on the resistive losses, that is, on series resistance Rs and on the resistance brought by the substrate to the ground connection.

A first solution to increase the quality factor of the inductance is to minimize its series resistance Rs. For this purpose, the width of the conductive track constituting of planar inductance 1 has to be increased. This results in increasing the value of the stray capacitances of dielectric 3 and, accordingly, the resistive losses in the substrate. A compromise thus has to be made according to the operating frequency for which the inductance is intended.

Another known solution to increase the quality factor is described in European patent application EP-A-0,780,853, which is incorporated herein by reference. An inductance structure on a silicon substrate including a conductive plane located between the inductance and the substrate is provided therein. This conductive plane, isolated from the substrate and from the inductance, is connected to ground or to a cold point of the circuit, to establish a "shielding" or "electrostatic screen" between the inductance and the semiconductor substrate. To avoid dissipation by creation of eddy currents in the conductive plane, said application provides a cutting-up of this conductive plane.

A type of inductance with a conductive plane cut-up according to an example of the above-mentioned application is illustrated in FIG. 3.

FIG. 3 shows, in a simplified perspective view, an inductance 1 formed, as previously, of one or several coplanar spirals made of a conductive material. Inductance 1 is separated from a conductive plane 7 by an insulating layer 8. Conductive plane 7 is itself deposited on an insulating layer (dielectric 3) resting on substrate 2 or on a metallization level. Conductive plane 7 is cut up in longitudinal strips 9 connected to a lateral strip 10. In the example illustrated in FIG. 3, longitudinal strips 9 are located on either side of inductance 1 by being connected to lateral end strips of conductive plane 7. The remaining conductive elements of plane 7 are grounded. The effect due to eddy currents is thus strongly decreased, but the structure of FIG. 3 has disadvantages.

A first disadvantage is that, for a general insulator thickness above substrate 2, the dielectric thickness available between the inductance and the conductive plane is reduced with respect to the case of FIG. 1.

Indeed, the conductive plane is:

either a metal layer or a polysilicon layer interposed between the inductance and the substrate, and thus reducing the dielectric thickness and increasing the stray capacitances between the inductance and the substrate or between the inductance and the conductive layer if said layer is grounded;

or a very heavily-doped layer, diffused in the silicon and the forming of which requires a dielectric etching (thick oxide (LOCOS) separating the active components from one another), and thus, in the end, a smaller dielectric thickness between the inductance and this diffused layer.

This results in an increase in the stray capacitances between the inductance and the ground while it is generally desired to minimize the value of the stray capacitance.

Another disadvantage of the structure provided in FIG. 3 is that, when inductance 1 is run through by a variable current, an electromotive force due to the inductive coupling existing between the strips and the inductance appears in each of strips 9. Similarly, an electromotive force due to the inductive coupling between lateral strip 10 and inductance 1 appears in this lateral strip. These electromotive forces cause losses. Indeed, each of the points of strips 9 and 10 is at a non-zero voltage with respect to the ground due to the induced electromotive forces and, thereby, losses occur via a capacitance due to layer 8 behaving as a dielectric and the ohmic resistance of the substrate. These ohmic capacitances and resistances are distributed variables, different at each point of conductive plane 7.

All these losses make the behavior of the structure of FIG. 3 unsatisfactory and lower quality factor Q of the inductance.

It should be noted that, for the solution provided by the above-mentioned European patent application to provide a result, the strips of the conductive plane needs to be, for the most part, located under the conductive track forming inductance 1.

The above-mentioned patent application provides other ways of cutting up the conductive plane (see FIGS. 7, 9, and 12 of this application). However, in all the provided examples of said application, the inductance is, for the most part, on conductive strips and there remain conductive plane portions in which a high induced electromotive force causes the undesirable effect which has been described.

SUMMARY OF THE INVENTION

The present invention aims at providing a novel integrated circuit inductance structure which overcomes the disadvantages of known structures.

The present invention more specifically aims at providing a solution which combines the advantages of a low stray capacitance and of a low ground access ohmic resistance.

The present invention also aims at providing a solution which reduces or minimizes the losses linked to the inductance operation and, in particular, which reduces or minimizes possible induced electromotive forces.

To achieve these objects as well as others, the present invention provides an integrated circuit inductance structure, including a silicon substrate, at least one planar winding of a conductive track, a resistive layer, not etched under the winding, a dielectric layer between the winding and said resistive layer, and discontinuous conductive sections, individually parallel to a portion of the winding which is the closest and electrically connected to ground and to said resistive layer.

According to an embodiment of the present invention, said conductive sections are, for the most part, not arranged under projections of the winding.

According to an embodiment of the present invention, each conductive section is placed as close as possible to the closest winding portion.

According to an embodiment of the present invention, each portion of the winding is associated, along its length, to several conductive sections.

According to an embodiment of the present invention, said conductive sections are connected to a contact point by several conductive tracks, each of the conductive tracks being arranged so that the resultant of the electromotive forces induced by the inductance is substantially null.

According to an embodiment of the present invention, each of the conductive tracks substantially is an axis of symmetry of the inductance.

According to an embodiment of the present invention, said conductive sections are formed in a same metallic level as the track forming an inductance.

According to an embodiment of the present invention, said resistive layer has a doping level ranging between $10^{16}$ and $10^{19}$ atoms/cm$^3$, preferably, on the order of $10^{17}$ atoms/cm$^3$.

The foregoing objects, features and advantages of the present invention will be discussed in detail in the following non-limiting description of specific embodiments in connection with the accompanying drawings.

DETAILED DESCRIPTION

A feature of the present invention is to eliminate the use of a conductive plane under inductance 1. More specifically, the present invention provides using a resistive level to form the lower armature of the stray capacitance of the inductance, connected to ground. According to the present invention, this ground connection is performed by means of conductive tracks associated with the resistive level and which have the feature of being majoritarily not located above inductance 1.

Figure 4:
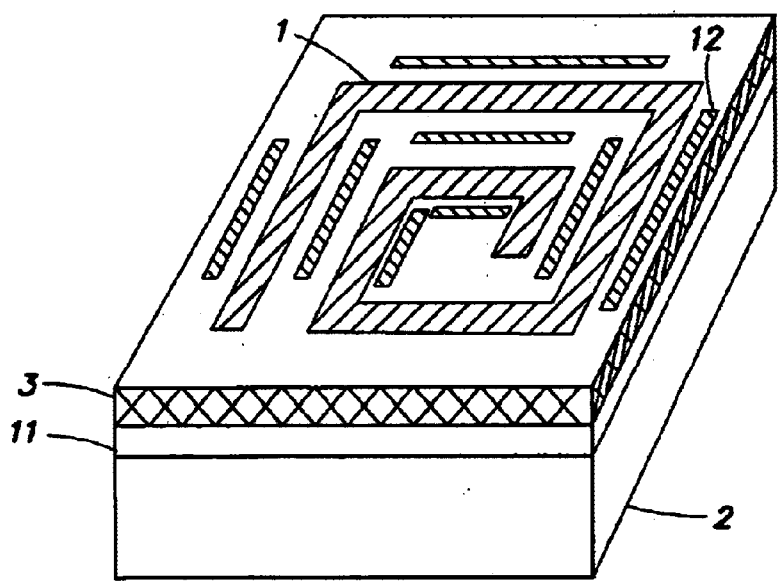
FIG. 4 shows, in a simplified perspective view, an inductance structure according to an embodiment of the present invention.

FIG. 4 shows, in a simplified perspective view, an embodiment of an inductance structure according to the present invention.

Figure 1:
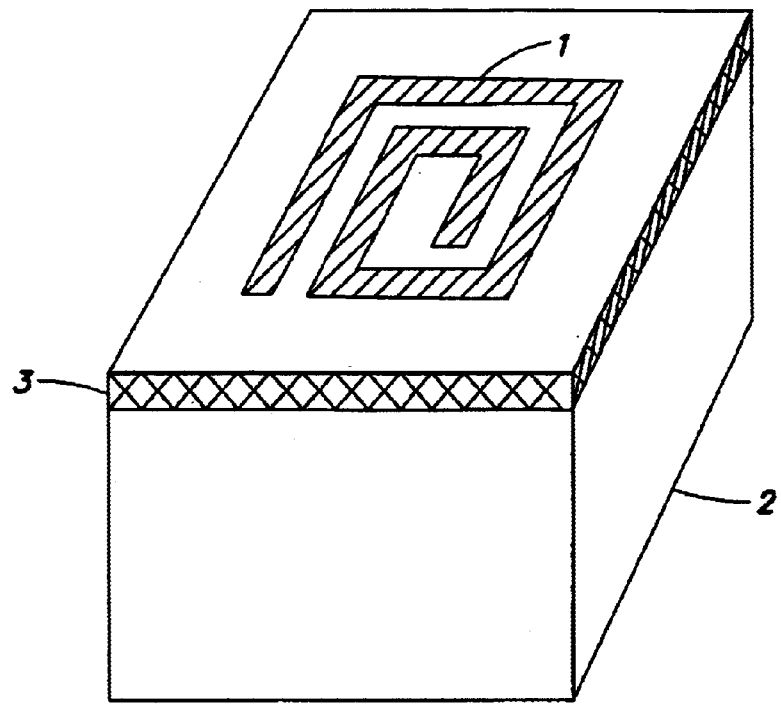
FIG. 1, previously described, shows an inductance deposited on a conductive substrate according to prior art.
Figure 2:
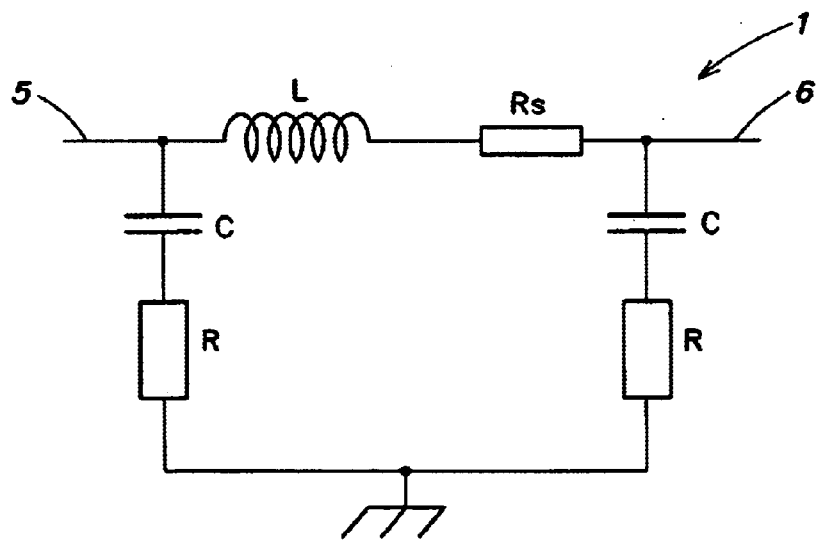
FIG. 2, previously described, shows the equivalent electric diagram of the inductance shown in FIG. 1.
Figure 3:
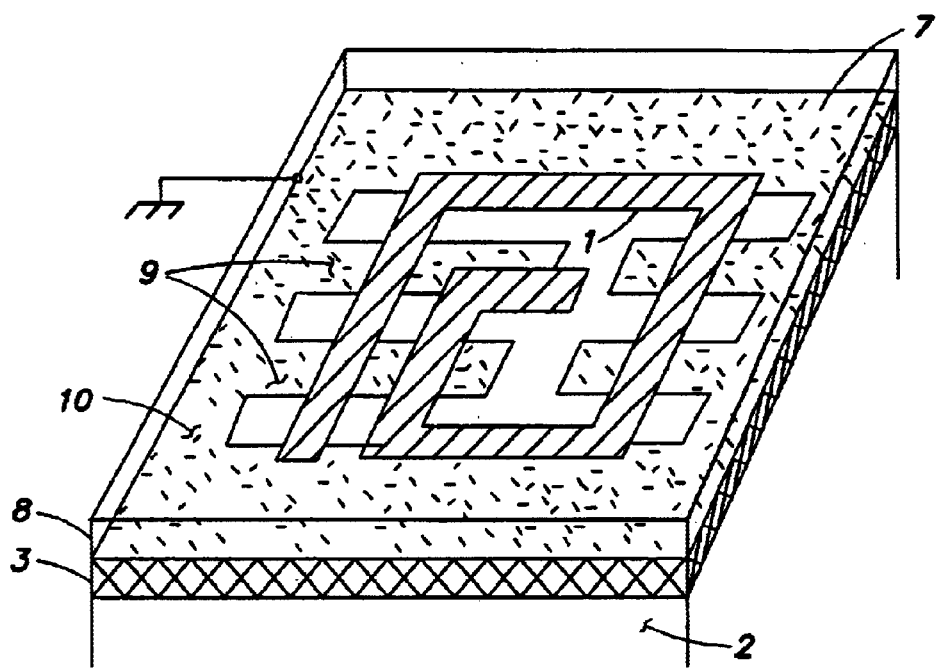
FIG. 3, previously described, shows another inductance structure deposited on a semiconductor substrate according to prior art.

As previously, inductance 1 is formed from a conductive track deposited in the form of a planar winding on an insulating layer 3. The structure of the present invention here resembles the structure of the conventional case of FIG. 1.

A feature of the present invention is to provide, under dielectric layer 3, a medium-doped semiconductor layer 11, generally more heavily doped than silicon substrate 2 on which it rests. The present invention here takes advantage of the presence, in an integrated circuit structure, of a layer more heavily doped than the substrate. This generally is an epitaxial layer in which are formed heavily-doped regions used to form the sources and drains of MOS transistors, the emitters of bipolar transistors, NPN transistor collector wells (sinkers).

The dielectric thickness between layer 11 and the inductance is maximum. The stray capacitance of the inductance is thus smaller than if an intermediary, metal or polysilicon layer, or a very heavily doped diffused layer, which requires a thick oxide etch (LOCOS), were used.

Figure 5:
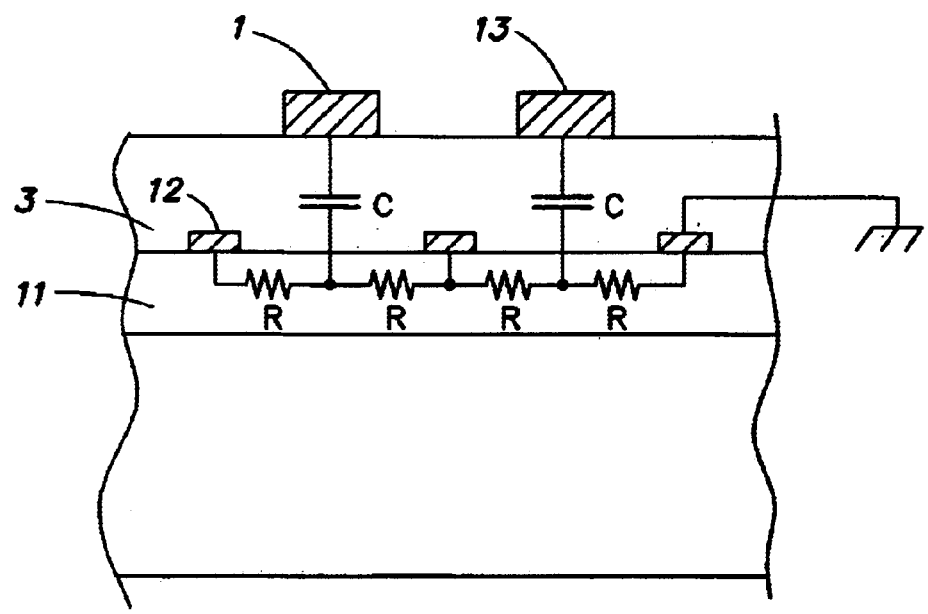
FIG. 5 is a partial cross-section view of the inductance shown in FIG. 4.
Figure 6:
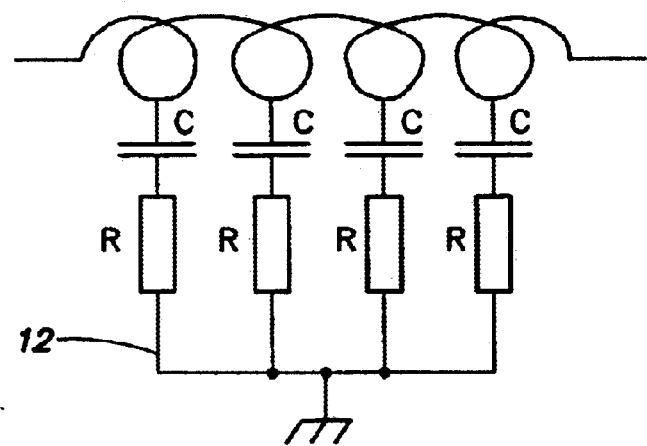
FIG. 6 shows the equivalent electric diagram of the inductance structure of FIG. 4.

FIG. 5 is a partial cross-section view of an inductance structure according to the present invention and FIG. 6 shows the equivalent electric diagram of such a structure. This equivalent diagram can be deduced from the discussion of FIG. 4 and of FIG. 5 in which capacitive and resistive elements also have been symbolized.

Conventionally, dielectric layer 3 introduces capacitive elements C under spiral sections 13 of inductance 1. These capacitive elements connect each spiral section to layer 11. Layer 11 is discontinuously connected to ground by means of sections 12 arranged parallel to the sections of inductance 1 by not being above the spiral. Accordingly, layer 11 introduces lateral resistances R between each spiral section 13 and a grounding element 12. The different lateral resistances are associated in parallel as illustrated by FIG. 6. Accordingly, the resistivity of layer 11 due to its doping must be sufficiently low to be negligible in the parallel association of the lateral resistances with respect to the vertical resistance of the substrate. However, the compromise to be made is that, to avoid occurrence of eddy currents, resistance R must be sufficiently high since layer 11 is continuous.

According to the present invention, layer 11 is chosen to have a doping greater than $10^{15}$ atoms/cm$^3$ corresponding to the substrate doping in BiCMOS technology, and smaller than $10^{20}$ corresponding to the doping of the NPN collector wells as well as of the sources and drains of MOS transistors or the emitters of NPN transistors. Preferably, layer 11 has a doping level ranging between $10^{16}$ and $10^{19}$ atoms/cm$^3$, preferably on the order of $10^{17}$ atoms/cm$^3$. Generally, the epitaxial layer or the N or P wells (in which are formed the elementary MOS transistors) formed with no etching of the thick oxide, which are provided to be used by the present invention, have a doping on the order of from $10^{16}$ to $10^{17}$ atoms/cm$^3$.

Another feature of the present invention is that conductive sections 12 having the function of connecting the lateral resistors to ground are, for the most part, arranged outside of the perpendicular to inductance 1, to avoid increasing its stray capacitance. It is however possible to provide sections 12 under the sections of the inductance.

As illustrated in FIG. 4, these conductive sections 12 are preferably narrow with respect to sections 13 constitutive of inductance 1.

An advantage of the present invention is that it takes advantage of the existence of an epitaxial layer in the integrated circuit structures providing an inductance.

Another advantage of the present invention is that it avoids use of a conductive level cut up above the spirals of inductance 1. Thus, the present invention enables maintaining a relatively high thickness of dielectric 3 for a given thickness of the integrated circuit multilayer.

Figure 7:
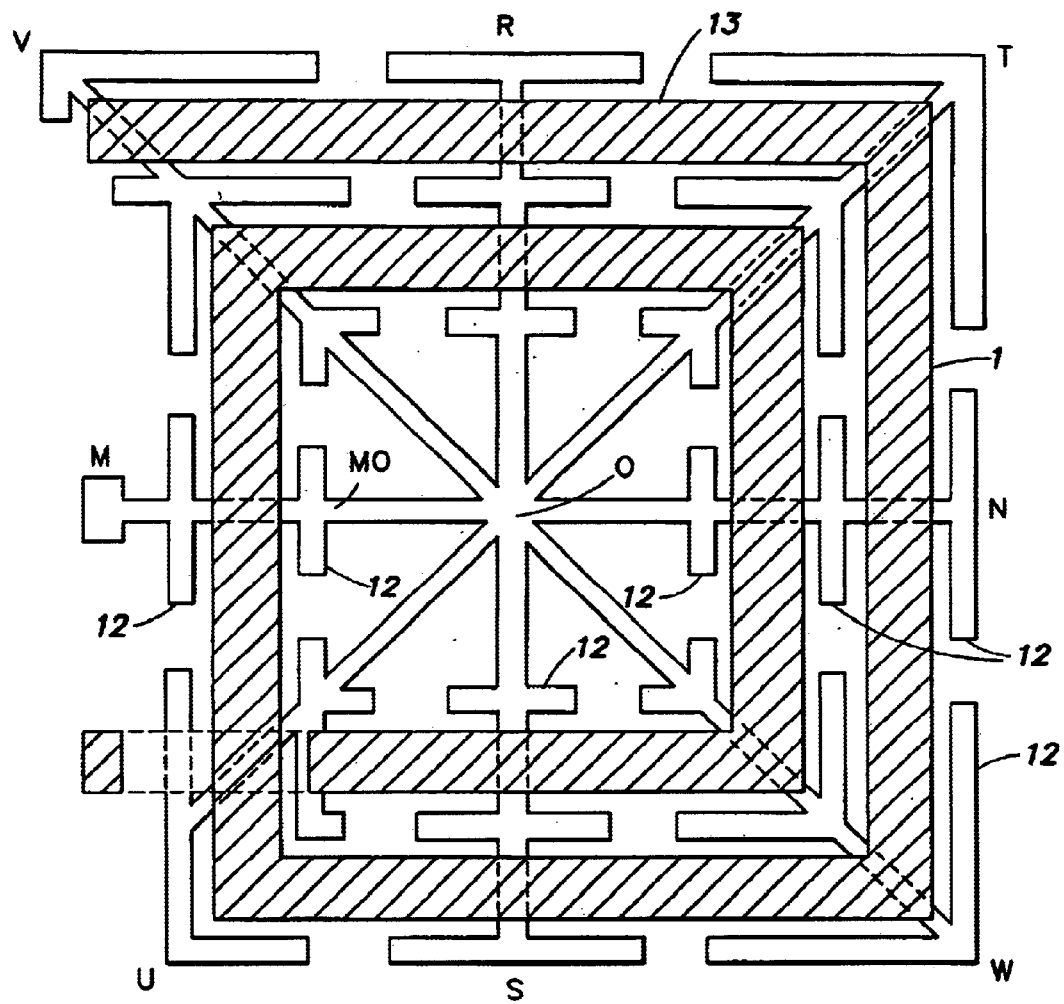
FIG. 7 shows, in a top view, an inductance structure according to a preferred embodiment of the present invention.

FIG. 7 shows, in a simplified top view, an embodiment of the present invention more specifically illustrating a preferred grounding mode of the discontinuous sections 12 provided parallel to sections 13 of spiral 1.

In this embodiment, the length of conductive sections 12 does not extend on either side of the considered rectilinear spiral portion 13. Conductive sections 12 are preferentially distributed in the number of three per rectilinear spiral portion 13. A contact point M intended to be connected to ground is connected to a point O corresponding to the center of inductance 1 by a conductive track MO, which connects to point M the conductive sections 12 that it crosses. Various other conductive tracks cross point O and connect a small number of conductive sections 12. Thus, the extension of track MO, track ON, connects three elements 12. A track ROS perpendicular to track MON connects other sections. Similarly, tracks VOW and TOU, in diagonal on FIG. 7, connect the remaining conductive sections, which surround the summits of inductance 1.

Preferably, these conductive tracks have a minimum width, compatible with the maximum tolerable resistance that they can have.

It should be noted that the tracks of interconnection to ground and the sections surrounding the spiral portions are not limited to rectilinear segments but are arranged to efficiently connect sections 12.

It should also be noted that node O is common to all the interconnection tracks which, due to track OM, are all electrically connected to ground contact point M. In practice, track OM is wider than the other tracks to efficiently drain, if necessary, residual currents to the outside of the spiral.

The arrangement of the conductive tracks connecting sections 12 has been chosen so that the resultant of the electromotive forces induced in the conductive tracks is substantially null. The fact that conductive sections 12 have a small size practically solves the problem of eddy currents. Only the problems due to induced electromotive forces remain to be considered.

Generally, the electromotive force induced in a first conductor by a second conductor run through by a variable current i has value e=−M.di/dt, M being the mutual inductance coefficient between the two conductors and di/dt the variation along time of current i running through the second conductor.

For two parallel rectilinear conductors, the mutual inductance coefficient is a function of the length of the conductors and of the distance separating them, M being all the higher as the length of the conductors increases and the distance between them is small. If the conductors are not parallel but form a certain angle, their mutual inductance coefficient is proportional to the cosine of the angle formed by the two conductors. Finally, when two conductors are perpendicular (their angle is 90°), the mutual inductance coefficient is zero.

Thus, to reduce electromotive forces induced in the conductive tracks and, accordingly, the losses undergone by inductance 1, three types of configuration are implemented as much as possible.

According to a first configuration, a conductive interconnection track (MON, ROS) is perpendicular to the spiral sections 13 that it crosses, which results in a null mutual inductance and an also null induced electromotive force.

According to a second configuration, each interconnection spiral is parallel to at least two spiral sections 13 and at equal distance between them. This amounts to placing these tracks at the center of each rectilinear spiral portion 13 and at the angles. Since each spiral of the inductance includes portions that conduct a current of the same absolute value and of reverse direction, the conductive tracks exhibit a mutual inductance with spirals 13 formed of two components, one positive and the other one negative. These components subtract and exactly annul if the number of spiral portions is the same on each side.

According to a third configuration, used for the inductance summits, an interconnection track is arranged along the bisector of the angle formed by the spiral portions. These portions being run through by currents of opposite direction (respectively directed towards or opposite to the summit of the angle that it forms), the mutual inductance resulting from these spiral portions and the considered track or track portion is also null, as well as the resulting electromotive force induced in the considered track or track section.

Thus, due to the structure according to the present invention, the resultants of the electromotive forces induced in the various conductive tracks of connection to the ground of the plane more heavily doped than the substrate appear to be null or to be close to zero. In fact, if the inductance was perfectly symmetrical, the above-described structure would enable perfect compensation of the electromotive forces induced in conductive tracks MON, ROS, TOU, VOW.

Of course, the inductance structure illustrated in FIG. 7 is an example only of the present invention and is likely to have various alterations, modifications, and improvements which will readily occur to those skilled in the art. In particular, the example of the drawings shows a square inductance. Of course, the present invention may be applied whatever the shape of the inductance, provided to respect the use of a semiconductor layer more heavily doped than the substrate and discontinuous conductive sections 12 of connection of this layer to ground, these sections being preferentially, for the most part, not above the winding.

Further, if the inductance spirals are circular or in a spiral and have a center, a rectangular shape may be kept for conductive sections 12. They will however have a trapezoidal shape limited by radiuses having a center corresponding to the spiral center. However, these elements will be radially arranged and their connection to the center will be made by conductive tracks also radially arranged, such a perfectly symmetrical structure having minimum losses.

Further, although conductive sections 12 have been shown on layer 11, the ground connections of layer 11 may be implemented by underlying sections. Similarly, the tracks of interconnection of sections 12 will be formed in an adapted level, the choice of which is within the abilities of those skilled in the art.

Finally, although the present invention has been described in relation with an inductance in a single plane, said inductance may be formed in several conductive levels connected in series or in parallel.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit inductance structure, including:
   a silicon substrate;
   at least one planar winding of a conductive track;
   a resistive layer, not etched under the winding;
   a dielectric layer between the winding and said resistive layer; and
   discontinuous conductive sections, individually parallel to a closest portion of the winding, and electrically connected to ground and to said resistive layer.

2. The structure of claim 1, wherein said conductive sections are, for the most part, not arranged under projections of the winding.

3. The structure of claim 1, wherein each conductive section is placed as close as possible to the closest portion of the winding.

4. The structure of claim 1, wherein each portion of the winding is associated, along its length, to several conductive sections.

5. The structure of claim 1, wherein said conductive sections are connected to a contact point by several conductive tracks, each of the conductive tracks being arranged so that the resultant of the electromotive forces induced by the inductance is substantially null.

6. The structure of claim 5, wherein each of the conductive tracks substantially is an axis of symmetry of the inductance.

7. The structure of claim 1, wherein said conductive sections are formed in a same metallic level as a track forming an inductance.

8. The inductance structure of claim 1, wherein said resistive layer has a doping level ranging between $10^{16}$ and $10^{19}$ atoms/cm$^3$, preferably, on the order of $10^{17}$ atoms/cm$^3$.

* * * * *